United States Patent
Horng

[11] Patent Number: 6,021,043
[45] Date of Patent: Feb. 1, 2000

[54] MINIATURE HEAT-DISSIPATING FAN WITH IMPROVED HALL ELEMENT AND CIRCUIT BOARD ARRANGEMENT

[75] Inventor: Alex Horng, Kaohsiung, Taiwan

[73] Assignee: Sunonwealth Electric Machine Industry Co., Ltd., Kaohsiung, Taiwan

[21] Appl. No.: 09/093,004

[22] Filed: Jun. 8, 1998

[30] Foreign Application Priority Data

Dec. 9, 1997 [TW] Taiwan .................................. 86220586

[51] Int. Cl.[7] ...................................................... H05K 7/20
[52] U.S. Cl. .......................... 361/695; 361/690; 361/694; 361/760; 310/67 R; 310/68 B
[58] Field of Search .................................... 361/690, 695; 310/67 R, 68 B, DIG. 6

[56] References Cited

U.S. PATENT DOCUMENTS

| | | | |
|---|---|---|---|
| 4,857,784 | 8/1989 | Mukaekubo | 310/68 B |
| 4,891,567 | 1/1990 | Fujitani et al. | 310/68 R |
| 5,008,573 | 4/1991 | Beppu et al. | 310/67 R |
| 5,436,519 | 7/1995 | Takahashi et al. | 310/217 |
| 5,705,873 | 1/1998 | Sato | 310/193 |

Primary Examiner—Donald Sparks
Assistant Examiner—Boris L. Chervinsky
Attorney, Agent, or Firm—Stevens, Davis, Miller & Mosher, L.L.P.

[57] ABSTRACT

A miniature heat-dissipating fan includes a stator seat having a winding wound therearound and an axle tube for rotatably receiving a rotor shaft. A circuit board is mounted around the axle tube and includes a straight edge. The circuit board further includes a number of leads each having an end led to the straight edge. A Hall element has a number of pins respectively connected to the leads of the circuit board, the pins being bendable along the straight edge of the circuit board.

4 Claims, 3 Drawing Sheets

MINIATURE HEAT-DISSIPATING FAN WITH IMPROVED HALL ELEMENT AND CIRCUIT BOARD ARRANGEMENT

BACKGROUND OF THE INVENTION

1. Field of the Invention

The present invention relates to a miniature heat-dissipating fan with an improved arrangement of the position of a Hall element and circuit board arrangement to allow the Hall element to be mounted to the circuit board by surface mount technology (SMT).

2. Description of the Related Art

FIG. 1 of the drawings illustrates a conventional miniature fan for dissipating heat generated by an integrated circuit. Such a fan includes a stator seat 9 having a winding 91 wound therearound and an axle tube 92 for rotatably receiving a rotor shaft (not shown). A circuit board 93 is mounted around the axle tube 92 and includes a number of holes 94 through which the pins 97 of a Hall element 95 are extended. The Hall element 95 is aligned with a front edge or a rear edge of a pole of the stator seat 9 so as to start the motor easily. In order to have a better positioning effect, the Hall element 95 is mounted on a fixing seat 96 which also has a number of holes to allow the pins 97 to pass therethrough for subsequent soldering. However, excessive lengths of the pins 97 have to be cut, and the Hall element 95 cannot be mounted to the circuit board 93 by the surface mount technology (SMT). Namely, intensive labor work for insertion and soldering of the pins are required, and the positions of the pins cannot be precisely located. Further, an additional fixing seat 96 is required. All of these aggravate the disadvantages of increased costs and waste of time for assembly. The present invention is intended to provide an improved miniature fan structure to solve these problems.

SUMMARY OF THE INVENTION

It is a primary object of the present invention to provide an improved miniature heat-dissipating fan which can be easily manufactured and assembled to lower the cost.

It is another object of the invention to provide an improved miniature heat-dissipating fan with improved Hall element and circuit board arrangement to allow the Hall element to be mounted to the circuit board by surface mount technology.

A miniature heat-dissipating fan in accordance with the present invention comprises a stator seat including a winding wound therearound and an axle tube for rotatably receiving a rotor shaft. A circuit board is mounted around the axle tube and includes a straight edge. The circuit board further includes a plurality of leads each having an end led to the straight edge. A Hall element has a plurality of pins respectively connected to the leads of the circuit board, the pins being bendable along the straight edge of the circuit board.

The pins of the Hall element may be fixed to the leads by soldering or surface mount technology.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
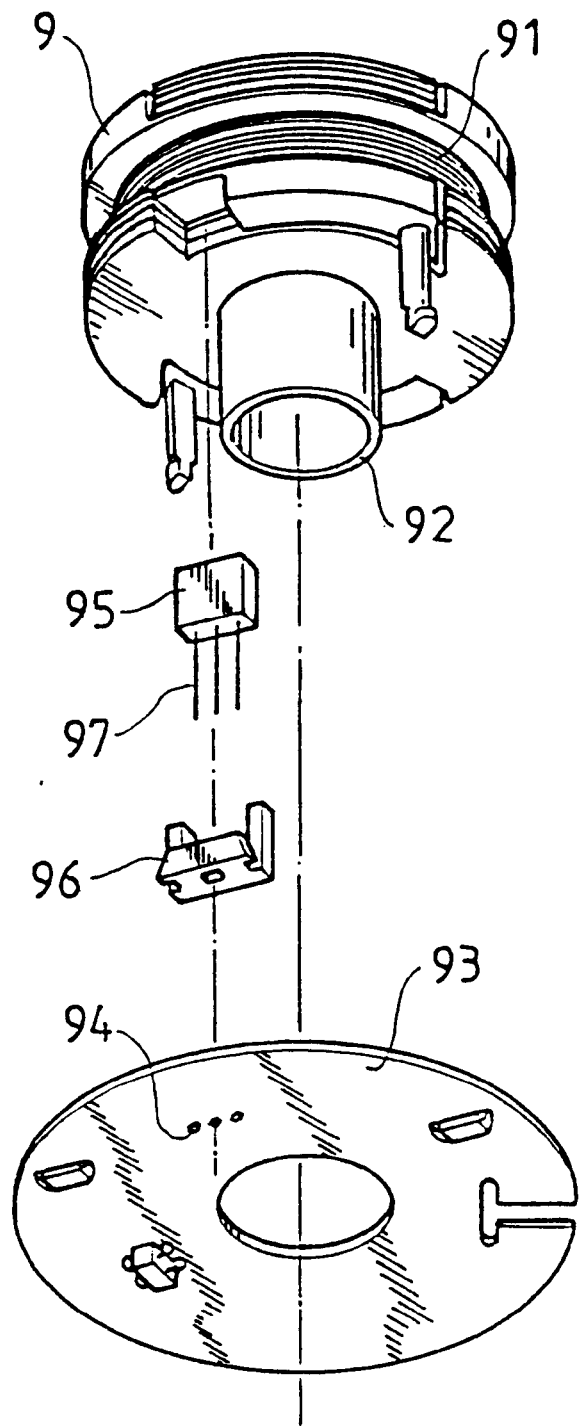
FIG. 1 is an exploded perspective view of a conventional miniature fan.
Figure 2:
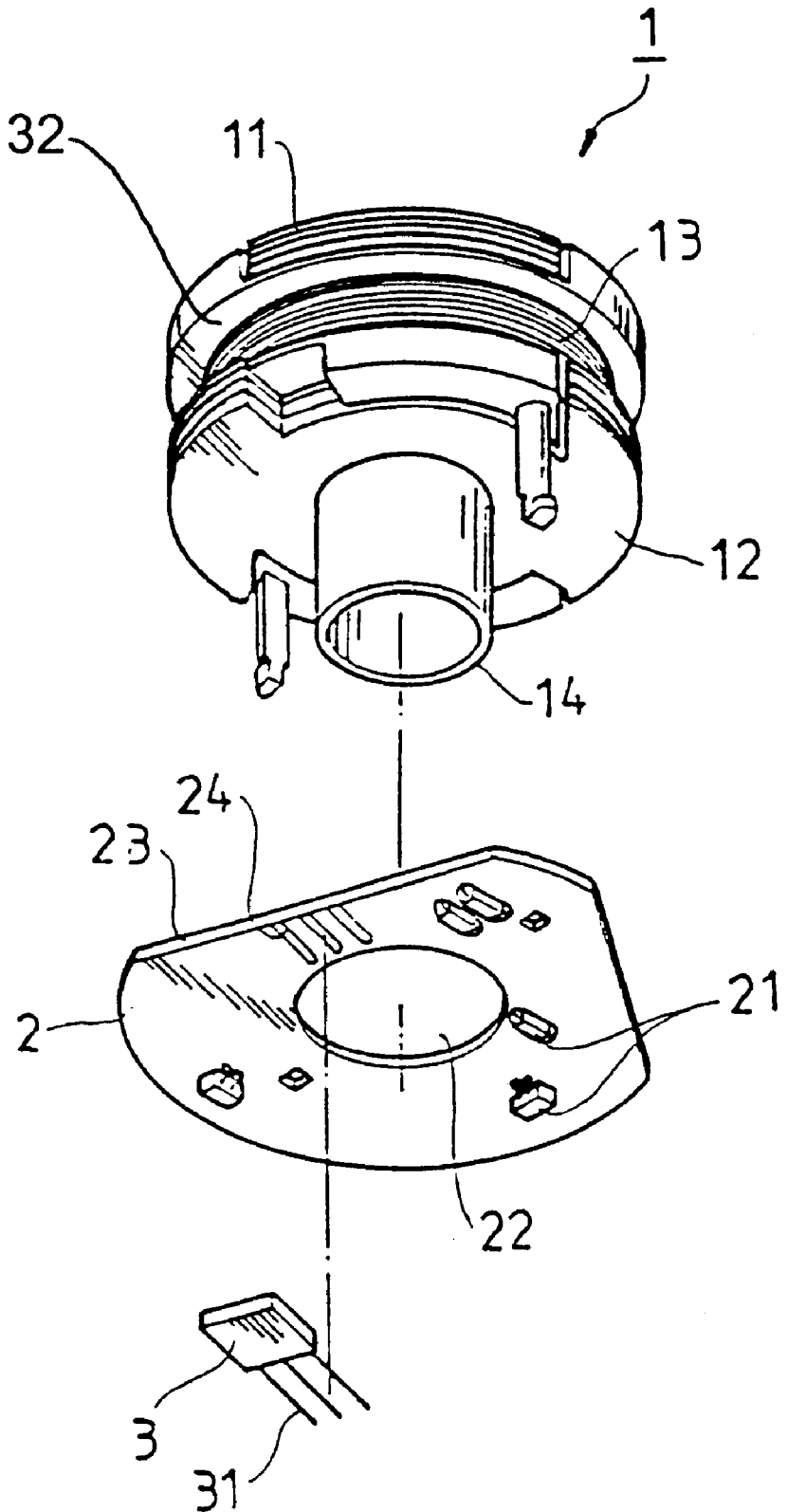
FIG. 2 is an exploded view of a miniature fan in accordance with the present invention.
Figure 3:
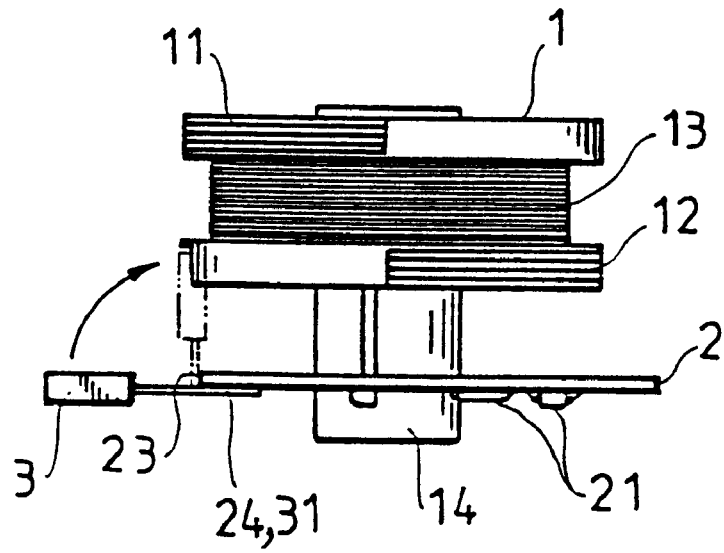
FIG. 3 is a side view of the miniature fan in accordance with the present invention.
Figure 4:
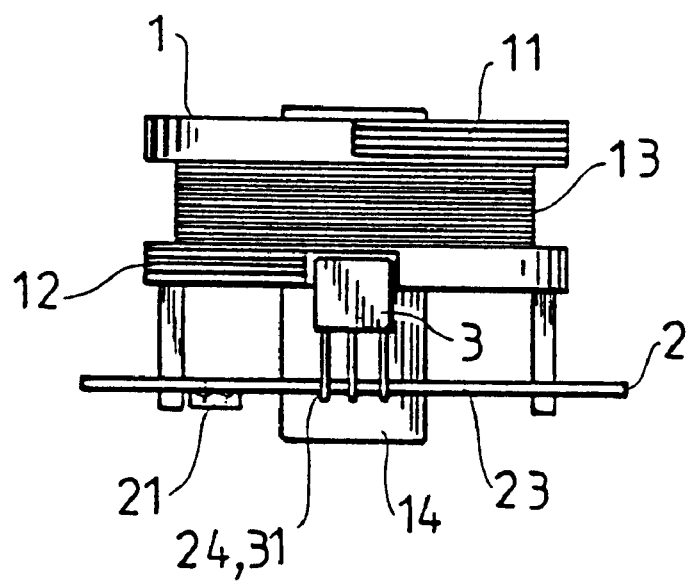
FIG. 4 is a side view viewed from a left side of the miniature fan in FIG. 3.

Referring to FIGS. 2 to 4 and initially to FIG. 2, a miniature fan in accordance with the present invention is provided for dissipating heat generated by an integrated circuit or the like. The miniature fan generally includes a stator seat 1 having upper and lower polar plates 11 and 12 and a winding 13 wound between the upper and lower polar plates 11 and 12. Each polar plate has an outer portion 32 for directing the magnetic flux to the gap that is between the polar plates and the rotor. The stator seat 1 further includes an axle tube 14 for rotatably receiving a rotor shaft (not shown) and for mounting polar plates 11, 12. The shaft is conventional and therefore not further described. The axle tube 14 may include a bearing mounted therein. Nevertheless, any suitable axle tubes may be used.

A circuit board 2 (e.g., a printed circuit board) includes a hole 22 so as to be mounted around the axle tube 14. The circuit board 2 includes a number of control elements 21 for controlling operation of the fan. In addition, the circuit board 2 includes a straight edge 23, and a number of leads 24 are formed on a side of the circuit board 2 and each of which has an end led to the straight edge 23. The Hall element includes a main body and a plurality of pins 31. The leads 24 may be formed on the circuit board 2 by means of printing, etching, etc., so as to provide conductive connections with pins 31 of a Hall element 3. The pins 31 of the Hall element 3 can be fixed to the leads 24 by soldering or surface mount technology (SMT). In addition, the pins 31 of the Hall element 3 can be bent along the straight edge of the circuit board. The main body of the Hall element is inserted into the space beneath the outer portion 32. (see Figs, 3 and 4) so as to provide a better sensing effecting and auxiliary starting effect. As the pins 31 extend in a direction perpendicular to the straight edge 23, the Hall element 3 can be located at a desired level by means of bending the pins 31 along the straight edge 23 (FIG. 3), while the pins 31 can be aligned precisely to avoid breakage thereof According to the above description, it is appreciated that the Hall element 3 can be mounted without manual insertion and cutting of the pins. In addition, the fixing seat 96 used in the conventional design is not required. Further, the surface mount technology can be used. All of these save costs and assembling time while ensuring better quality of the products.

Although the invention has been explained in relation to its preferred embodiment, it is to be understood that many other possible modifications and variations can be made without departing from the spirit and scope of the invention as hereinafter claimed.

What is claimed is:

1. A miniature heat-dissipating fan, comprising:
    a stator seat comprising a winding wound therearound, an axle tube disposed in a center portion of said stator seat, said axle tube for rotatably receiving a rotor shaft, and an upper polar plate and a lower polar plate respectively mounted on said axle tube on upper and lower surfaces of said winding, said lower polar plate having an outer portion which extends radially past said winding;

a circuit board mounted around said axle tube and below said lower polar plate, said circuit board having a straight edge and a plurality of leads, each of said leads having an edge leading to the straight edge; and a Hall element having a main body and a plurality of pins, each of said pins being connected to a respective lead of said plurality of leads of said circuit board, wherein:

said plurality of pins of said Hall element are oriented along and in contact with the straight edge of said circuit board, and the main body of said Hall element is disposed in a space beside the outer portion of said lower polar plate.

2. The miniature heat-dissipating fan according to claim 1, wherein said pins of the Hall element are fixed to the leads by soldering.

3. The miniature heat-dissipating fan according to claim 1, wherein the pins of said Hall element are fixed to the leads using surface mount technology (SMT).

4. The miniature heat-dissipating fan according to claim 1, wherein said upper polar plate has an outer portion which extends radially past said winding.

* * * * *